United States Patent
Guo

(10) Patent No.: US 10,937,958 B2
(45) Date of Patent: Mar. 2, 2021

(54) MAGNETORESISTIVE ELEMENT HAVING A NOVEL CAP MULTILAYER

(71) Applicant: Yimin Guo, San Jose, CA (US)

(72) Inventor: Yimin Guo, San Jose, CA (US)

( * ) Notice: Subject to any disclaimer, the term of this patent is extended or adjusted under 35 U.S.C. 154(b) by 0 days.

(21) Appl. No.: 16/686,081

(22) Filed: Nov. 15, 2019

(65) Prior Publication Data

US 2020/0083437 A1 Mar. 12, 2020

Related U.S. Application Data

(63) Continuation-in-part of application No. 14/073,844, filed on Nov. 6, 2013, now Pat. No. 10,522,589.

(51) Int. Cl.
| | |
|---|---|
| H01L 43/12 | (2006.01) |
| H01L 43/02 | (2006.01) |
| H01L 43/10 | (2006.01) |
| H01L 27/22 | (2006.01) |
| H01L 43/14 | (2006.01) |
| H01L 43/06 | (2006.01) |

(52) U.S. Cl.
CPC ............ *H01L 43/12* (2013.01); *H01L 27/222* (2013.01); *H01L 43/02* (2013.01); *H01L 43/06* (2013.01); *H01L 43/10* (2013.01); *H01L 43/14* (2013.01)

(58) Field of Classification Search
CPC ..... H01L 27/222; H01L 27/224; H01L 43/00; H01L 43/02; H01L 43/04; H01L 43/06; H01L 43/065; H01L 43/10; H01L 43/12; H01L 43/14
See application file for complete search history.

(56) References Cited

U.S. PATENT DOCUMENTS

| | | | |
|---|---|---|---|
| 10,522,589 B2* | 12/2019 | Guo | |
| 2008/0080102 A1* | 4/2008 | Ibusuki | G01R 33/098 360/324.2 |
| 2010/0244163 A1* | 9/2010 | Daibou | G11C 11/161 257/421 |
| 2012/0063218 A1* | 3/2012 | Huai | H01F 10/3286 365/171 |
| 2016/0163964 A1* | 6/2016 | Whig | H01L 43/02 257/421 |
| 2016/0225981 A1* | 8/2016 | Deshpande | H01L 43/12 |
| 2017/0084829 A1* | 3/2017 | Lee | G11C 11/161 |
| 2018/0277744 A1* | 9/2018 | Toko | H01L 43/12 |
| 2018/0315796 A1* | 11/2018 | Lee | H01L 45/146 |

* cited by examiner

*Primary Examiner* — Eduardo A Rodela

(57) ABSTRACT

A method of forming a magnetoresistive element comprises of forming a novel Boron-absorbing cap layer provided on the top surface of an amorphous CoFeB (or CoB, FeB) ferromagnetic recording layer. As the magnetoresistive film is thermally annealed, a crystallization process occurs to form bcc CoFe grains having epitaxial growth with (100) plane parallel to the surface of the tunnel barrier layer as Boron elements migrate into the novel Boron-absorbing cap layer. Removing the top portion of the Boron-absorbing cap layer by means of sputtering etch or RIE etch processes followed by optional oxidization process, a thin thermally stable portion of cap layer is remained on top of the recording layer with low damping constant. Accordingly, a reduced write current is achieved for spin-transfer torque MRAM application.

14 Claims, 2 Drawing Sheets

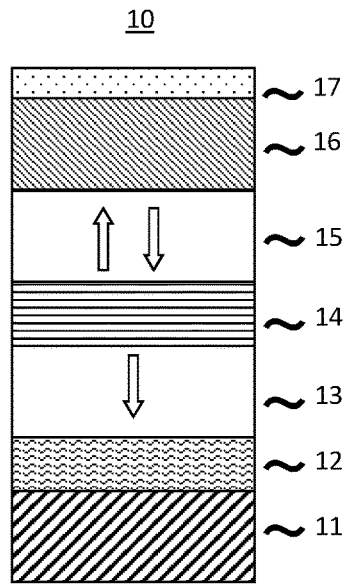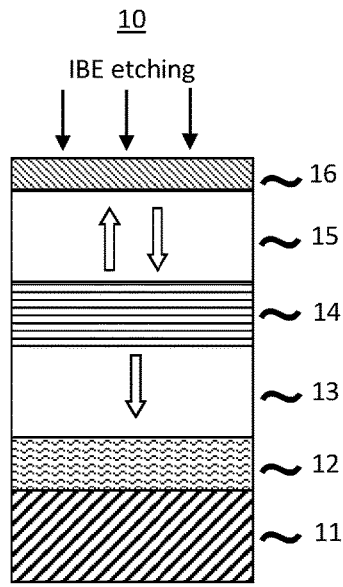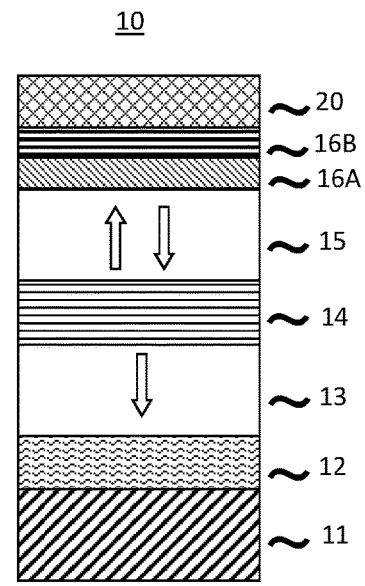
FIG. 1A  FIG. 1B  FIG. 2
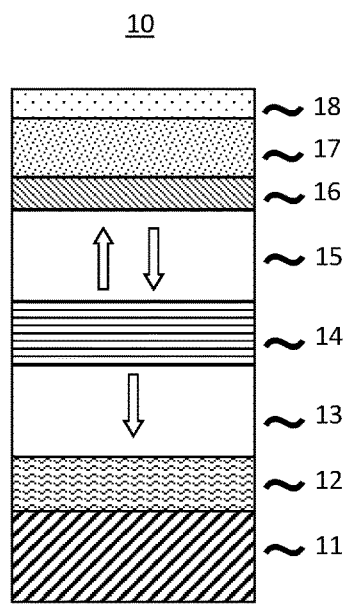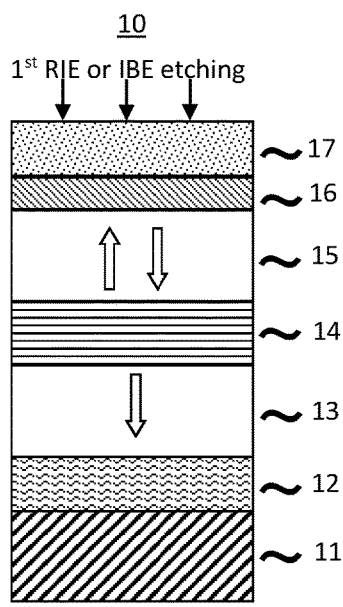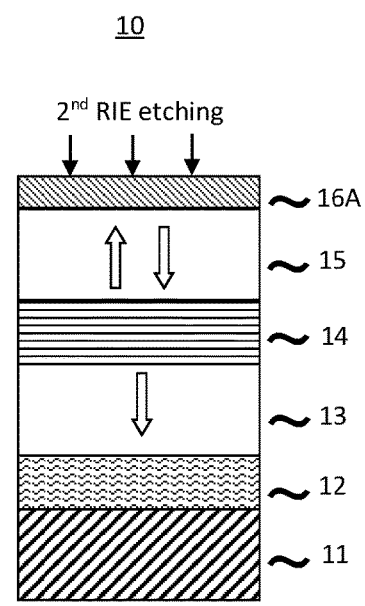
FIG. 3A  FIG. 3B  FIG. 3C

MAGNETORESISTIVE ELEMENT HAVING A NOVEL CAP MULTILAYER

RELATED APPLICATIONS

This application is a continuation in part of the U.S. utility patent application Ser. No. 14/073,844 filed on Nov. 6, 2013. This application seeks priority to U.S. provisional patent application No. 61/745,757, filed on Dec. 24, 2012; the entire contents of each of which are incorporated herein by reference.

BACKGROUND OF THE INVENTION

1. Field of the Invention

This invention relates to the field of magnetoresistive elements. More specifically, the invention comprises spin-transfer-torque magnetic-random-access memory (MRAM) using magnetoresistive elements as basic memory cells which potentially replace the conventional semiconductor memory used in electronic chips, especially mobile chips for power saving and non-volatility.

2. Description of the Related Art

In recent years, magnetic random access memories (hereinafter referred to as MRAMs) using the magnetoresistive effect of ferromagnetic tunnel junctions (also called MTJs) have been drawing increasing attention as the next-generation solid-state nonvolatile memories that can cope with high-speed reading and writing, large capacities, and low-power-consumption operations. A ferromagnetic tunnel junction has a three-layer stack structure formed by stacking a recording layer having a changeable magnetization direction, an insulating spacing layer, and a fixed reference layer that is located on the opposite side from the recording layer and maintains a predetermined magnetization direction.

As a write method to be used in such magnetoresistive elements, there has been suggested a write method (spin torque transfer switching technique) using spin momentum transfers. According to this method, the magnetization direction of a recording layer is reversed by applying a spin-polarized current to the magnetoresistive element. Furthermore, as the volume of the magnetic layer forming the recording layer is smaller, the injected spin-polarized current to write or switch can be also smaller. Accordingly, this method is expected to be a write method that can achieve both device miniaturization and lower currents.

Further, as in a so-called perpendicular MTJ element, both two magnetization films have easy axis of magnetization in a direction perpendicular to the film plane due to their strong magnetic crystalline anisotropy (shape anisotropies are not used), and accordingly, the device shape can be made smaller than that of an in-plane magnetization type. Also, variance in the easy axis of magnetization can be made smaller. Accordingly, by using a material having a large perpendicular magnetic crystalline anisotropy, both miniaturization and lower currents can be expected to be achieved while a thermal disturbance resistance is maintained.

There has been a known technique for achieving a high MR ratio in a perpendicular MTJ element by forming an underneath MgO tunnel barrier layer and a bcc or hcp-phase cap layer that sandwich a thin recoding layer having an amorphous CoFeB ferromagnetic film and accelerate crystallization of the amorphous ferromagnetic film to match interfacial grain structure to MgO layer through a thermal annealing process. The recording layer crystallization starts from the tunnel barrier layer side to the cap layer and forms a CoFe grain structure having a perpendicular magnetic anisotropy, as Boron elements migrate into the cap layer. Accordingly, a coherent perpendicular magnetic tunneling junction structure is formed. By using this technique, a high MR ratio can be achieved.

However, where a cap layer is used for achieving a high MR ratio in an MTJ element, the cap layer may increase the damping constant of the recording layer, due to the so-called spin-pumping effect. Further, the damping constant of the recording layer may also increase from the additional cap layer material diffusion during the heat treatment in the device manufacturing process.

In a spin-injection MRAM using either a perpendicular or planar magnetization film, a write current is proportional to the damping constant and inversely proportional to a spin polarization. Therefore, reduction of the damping constant and increase of the spin polarization are mandatory technologies to reduce the write current.

BRIEF SUMMARY OF THE PRESENT INVENTION

The present invention comprises perpendicular magnetoresistive elements and methods of manufacturing such perpendicular magnetoresistive elements for perpendicular spin-transfer-torque MRAM.

The perpendicular magnetoresistive element in the invention is sandwiched between an upper electrode and a lower electrode of each MRAM memory cell, which also comprises a write circuit which bi-directionally supplies a spin polarized current to the magnetoresistive element and a select transistor electrically connected between the magnetoresistive element and the write circuit.

The perpendicular magnetoresistive element comprises: a reference layer having magnetic anisotropy in a direction perpendicular to a film surface and having an invariable magnetization direction; a tunnel barrier layer on the reference layer; a recording layer having magnetic anisotropy in a direction perpendicular to a film surface and having a variable magnetization direction on the tunnel barrier layer; and a novel cap multilayer provided on a surface of the recording layer, wherein at least the top portion of the cap multilayer (sacrificial layer) is later removed after conducting a thermal annealing process on the magnetoresistive film and leaves a thermally stable bottom cap layer interfacing to the recording layer.

As an amorphous ferromagnetic material, like CoFeB, in the recording layer is thermally annealed, a crystallization process occurs to form bcc CoFe grains having epitaxial growth with (100) plane parallel to the surface of the tunnel barrier layer to form a perpendicular anisotropy as Boron elements migrate into the Boron-absorbing cap layer. Removing the top portion of the cap layer by means of sputtering etch or RIE etch processes followed by an optional oxidization process, a thin thermally stable portion of cap layer is remained on top of the recording layer, accordingly, a recording layer having a low damping constant and a reduced write current is achieved.

The present invention also comprises planar magnetoresistive elements and methods of manufacturing such planar magnetoresistive elements for perpendicular spin-transfer-torque MRAM.

BRIEF DESCRIPTION OF THE DRAWINGS

FIG. 1A is a cross-sectional view showing a configuration of an MTJ element 10 as deposited, according to the first embodiment;

FIG. 1B is a cross-sectional view showing a configuration of an MTJ element 10 after IBE etching process to remove the protective layer and top portion of the cap layer, according to the first embodiment;

FIG. 2 is a cross-sectional view showing a configuration of an MTJ element 10 after an optional top surface oxidization of the remaining cap layer, followed by deposition of a upper-contact multilayer film comprising a buffer layer and a photoresist layer;

FIG. 3A is a cross-sectional view showing a configuration of an MTJ element 10 as deposited, according to the second embodiment;

FIG. 3B is a cross-sectional view showing a configuration of an MTJ element 10 after the $1^{st}$ RIE or IBE etching process to remove the protective layer, according to the second embodiment;

FIG. 3C is a cross-sectional view showing a configuration of an MTJ element 10 after the $2^{nd}$ RIE etching process to remove the second cap sub-layer, according to the second embodiment;

DETAILED DESCRIPTION OF THE INVENTION

Figure 4A:
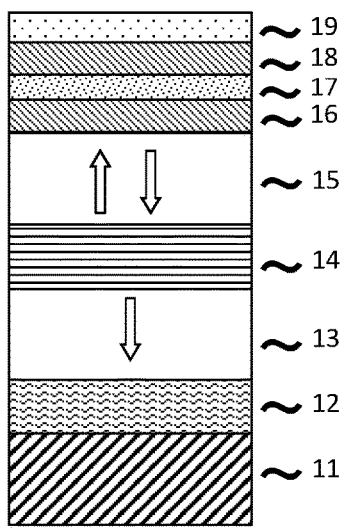
FIG. 4A is a cross-sectional view showing a configuration of an MTJ element 10 as deposited, according to the third embodiment.

In general, according to one embodiment, there is provided a magnetoresistive element comprising:

a reference layer having magnetic anisotropy and having an invariable magnetization direction;

a tunnel barrier layer provided on the reference layer;

a recording layer provided on the tunnel barrier layer and having a variable magnetization direction;

a cap layer provided on top surface of the recording layer;

a protective layer provided on top surface of the cap layer, wherein the protective layer and at least the top portion of the cap layer (sacrificial layer) are later removed after conducting a thermal annealing process on the magnetoresistive film and leaves a thermally stable bottom cap layer interfacing to the recording layer;

an optional oxidization process provided to oxidize the top surface of the remaining cap layer;

and an upper-contact multilayer provided on the remaining cap layer, comprising a buffer layer and a photoresist layer for further photo-lithographic processes of a magnetoresistive element.

First Embodiment

FIG. 1 is a cross-sectional view showing a configuration of an MTJ element 10 as deposited according to the first embodiment. The MTJ element 10 is configured by stacking a bottom electrode 11, a base layer 12, a reference layer 13, a tunnel barrier layer 14, a recording layer 15, a cap layer 16, and a protective layer 17 in this order from the bottom.

The reference layer 13 and the recording layer 15 are made of a ferromagnetic material, and have uni-axial magnetic anisotropy in a direction perpendicular to a film surfaces. Further, directions of easy magnetization of the reference layer 13 and the recording layer 15 are also perpendicular to the film surfaces. In another word, the MTJ element 10 is a perpendicular MTJ element in which magnetization directions of the reference layer 13 and the recording layer 15 face in directions perpendicular to the film surfaces. A direction of easy magnetization is a direction in which the internal magnetic energy is at its minimum where no external magnetic field exists. Meanwhile, a direction of hard magnetization is a direction which the internal energy is at its maximum where no external magnetic field exists.

The recording layer 15 has a variable (reversible) magnetization direction. The reference layer 13 has an invariable (fixing) magnetization direction. The reference layer 13 is made of a ferromagnetic material having a perpendicular magnetic anisotropic energy which is sufficiently greater than the recording layer 14. This strong perpendicular magnetic anisotropy can be achieved by selecting a material, configuration and a film thickness. In this manner, a spin polarized current may only reverse the magnetization direction of the recording layer 15 while the magnetization direction of the reference layer 13 remains unchanged. An MTJ element 10 which comprises a recording layer 15 having a variable magnetization direction and a reference layer 13 having an invariable magnetization direction for a predetermined write current can be achieved.

The tunnel barrier layer 14 is made of a non-magnetic insulating metal oxide or nitride.

The cap layer 16 is a low electro-negativity and low diffusivity metal layer or a metal alloy layer having a bcc or hcp-phase and having at least a thickness of 50 angstroms. The cap layer serves to introduce or improve perpendicular magnetic anisotropy of the recording layer 15. As an amorphous ferromagnetic material, like CoFeB, in the recording layer is thermally annealed, a crystallization process occurs to form bcc CoFe grains having epitaxial growth with (100) plane parallel to surface of the tunnel barrier layer and a perpendicular anisotropy is induced in the recording layer, as Boron elements migrate into the cap layer having a low electro-negativity. A damping constant of the recording layer 15 sometimes increases (deteriorates) depending on a material in contact with the recording layer 15, which is known as a spin pumping effect. The cap layer 16 may also have a function to prevent increase of the damping constant of the recording layer 15 by reducing the spin pumping. Further, the thickness of the cap layer 15 is selected to be big enough that it serves as a good absorber for the Boron elements from the recording layer to achieve better epitaxial CoFe crystal grains in the recoding layer having an ultra-low damping constant.

An example configuration of the MTJ element 10 will be described below. The reference layer 13 is made of CoFeB (around 2 nm)/TbCoFe(around 20 nm). The tunnel barrier layer 14 is made of MgO(around 1 nm). The recording layer 15 is made of CoFeB(around 1.2 nm). The cap layer 16 is made of Ti(around 10 nm). The protective layer 17 is made of Ru(around 10 nm). The base layer 12 is made of Ta(around 20 nm)/Cu(around 20 nm)/Ta(around 20 nm). Each element written in the left side of "/" is stacked above an element written in the right side thereof.

The CoFeB (with Boron content no less than 10% and no more than 30%) layer comprised in the recording layer 15 is in an amorphous state as deposited. The MgO layer comprised in the tunnel barrier layer 14 is formed into rocksalt crystal grains with the (100) plane parallel to the substrate plane. During a thermal annealing with a temperature higher than 250-degree C., the Boron elements of the CoFeB migrate into its above Ti cap layer to form $TiB_2$ since Ti has much lower electro-negativity than Co and Fe, and the amorphous CoFeB is crystallized to form bcc CoFe grains having epitaxial growth with (100) plane parallel to the surface of the MgO crystal tunnel barrier layer. A thick Ti cap layer is essential to absorb as many as Boron atoms as possible and achieve better epitaxial bcc CoFe crystal grains. A relatively pure CoFe film has a lower damping constant than an amorphous CoFeB film. A typical damping constant for a pure CoFe is around 0.003, while CoFeB has a damping constant of 0.01. Accordingly, a perpendicular magnetization having a low damping constant is induced in the recording layer.

After the thermal annealing process, an IBE etching process is adopted to etch away the Ru protective layer and the top portion of the Ti cap layer, leaving a much thinner remaining Ti cap layer for an easy integration with very small dimension lithographic patterning process, as shown in FIG. 1B. An upper contact layer 19 (not shown) comprising a buffer layer and a photoresist layer is then deposited on the top of MTJ film after the etching.

An optional surface oxidization process may also be added before the upper contact layer deposition. A surface oxidization process, i.e. by using of a mixed gas containing natural oxygen ($O_2$), or radical oxygen and Argon (Ar), may also be adopted before the deposition of the upper contact layer. Doing so, a thin oxide layer 16B is formed between the remaining cap layer 16A and the upper contact layer 20 for better interfacial thermal stability and less diffusion. The final configuration of the MTJ element 10, which is ready for MTJ element photolithographic patterning process, is shown in FIG. 2.

Second Embodiment

FIG. 3A is a cross-sectional view showing an example configuration of the MTJ element 10 as deposited according to the second embodiment. As shown in FIG. 3A, the reference layer 13 is made of CoFeB(around 2 nm)/TbCoFe (around 20 nm). The tunnel barrier layer 14 is made of MgO(around 1 nm). The recording layer 15 is made of CoFeB(around 1.2 nm). The first cap sub-layer 16 is made of Ti(around 2 nm). The second cap sub-layer 17 is made of Ta(around 10 nm). The protective layer 18 is made of Ru(around 10 nm). The base layer is made of Ta(around 20 nm)/Cu(around 20 nm)/Ta(around 20 nm). Each element written in the left side of "/" is stacked above an element written in the right side thereof.

Similar to the first embodiment, the CoFeB (with Boron content no less than 10% and no more than 30%) layer comprised in the recording layer 15 is formed into an amorphous state as deposited. During a thermal annealing with a temperature higher than 250-degree, the Boron elements of the CoFeB migrate first into its above thin Ti cap sub-layer 16 and further across Ti cap sub-layer into the Ta cap sub-layer 17, since Ta atom has a even lower electro-negativity and a stronger Boron-bonding than Ti atom. The ionicity of metal-Boron bonds decreases in the following order: Mg, Al, Mn, Y, Cr, Zr, Hf, Nb, Ta, V and Ti. Accordingly, the amorphous CoFeB in the recording layer is crystallized to form bcc CoFe grains having epitaxial growth with (100) plane parallel to surface of the MgO crystal tunnel barrier layer, and a perpendicular magnetization having a low damping constant is induced in the recording layer.

After the thermal annealing process, a RIE etching process utilizing $CH_3OH$ gas, or $NH_3$+CO mixed gas chemistry can be employed to etch away the protective Ru layer 18 and the second cap Ta sub-layer serves as its etch-stop layer, as shown in FIG. 3B. Alternatively, an IBE etching process is utilized to etch away the protective Ru layer 18 and the upper portion of the second cap Ta sub-layer 17. The remaining Ta cap sub-layer is readily removed by the $2^{nd}$ RIE etching process utilizing $CF_4$ gas chemistry, leaving a thin Ti first cap sub-layer, as shown in FIG. 3C, for an easy integration with very small dimension lithographic patterning process. Following an optional surface oxidization process, also similar to the first embodiment, an upper contact layer 20 comprising a buffer layer and a photoresist layer is then deposited on the top of MTJ film, and the final configuration of the MTJ element 10, which is ready for MTJ element photolithographic patterning process, is shown in FIG. 2.

Third Embodiment

FIG. 4A is a cross-sectional view showing an example configuration of the MTJ element 10 according to the third embodiment. As shown in FIG. 4A, the reference layer 13 is made of CoFeB(around 2 nm)/TbCoFe(around 20 nm). The tunnel barrier layer 14 is made of MgO(around 1 nm). The recording layer 15 is made of CoFeB(around 1.2 nm). The first cap sub-layer 16 is made of Ti(around 2 nm). The second cap sub-layer 17 is made of Ta(around 3 nm). The third cap sub-layer 18 is made of Hf(around 10 nm). The protective layer is made of Ru(around 10 nm). The base layer is made of Ta(around 20 nm)/Cu(around 20 nm)/Ta (around 20 nm). Each element written in the left side of "/" is stacked above an element written in the right side thereof.

Similar to the first and second embodiments, the CoFeB (with Boron content no less than 10% and no more than 30%) layer comprised in the recording layer 15 is formed into an amorphous state as deposited. During a thermal annealing with a temperature higher than 250-degree, the Boron elements of the CoFeB migrate first into its above thin Ti cap sub-layer 16 and thin Ta cap sub-layer 17, and further across them into the Hf cap sub-layer 18, since Hf atom has a even lower electro-negativity and a stronger Boron-bond than both of Ti atom and Ta atom. From the first cap sub-layer to the third cap sub-layer, the bond iconicity with Boron atom gradually increases and more effectively attracts or absorbs Boron elements from the CoFeB recording layer. Accordingly, the amorphous CoFeB in the recording layer is crystallized to form better bcc CoFe grains having epitaxial growth with (100) plane parallel to surface of the MgO crystal tunnel barrier layer, and a perpendicular magnetization having a low damping constant is induced in the recording layer.

Figure 4B:
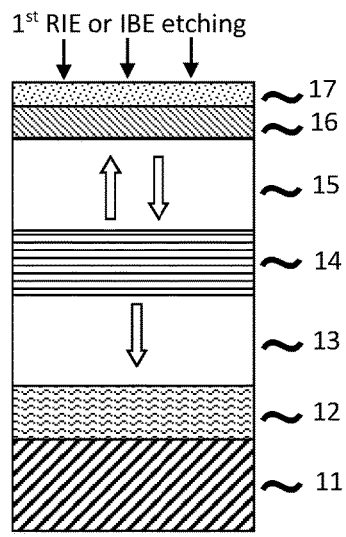
FIG. 4B is a cross-sectional view showing a configuration of an MTJ element 10 after the $1^{st}$ RIE or IBE etching process to remove the protective layer and the third cap sub-layer, according to the third embodiment.
Figure 4C:
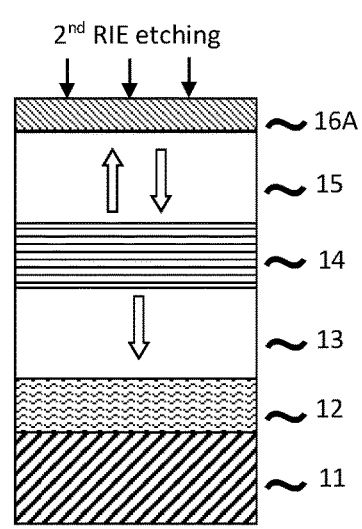
FIG. 4C is a cross-sectional view showing a configuration of an MTJ element 10 after the $2^{nd}$ RIE etching process to remove the second cap sub-layer, according to the third embodiment.

After the thermal annealing process, the $1^{st}$ RIE etching process using $CH_3OH$ gas, or $NH_3$+Co mixed gas chemistry is employed to etch away the protective Ru layer 19 and the third cap Hf sub-layer 18, stopping at Ta cap sub-layer 17, as shown in FIG. 4B. The remaining Ta cap sub-layer is then readily removed by the $2^{nd}$ RIE etching process using $CF_4$ gas chemistry, leaving a thin Ti first cap sub-layer, as shown in FIG. 4C, for an easy integration with very small dimension lithographic patterning process. Following an optional surface oxidization process, also similar to the first embodiment, an upper contact layer 20 comprising a buffer layer and a photoresist layer is then deposited on the top of MTJ film, and the final configuration of the MTJ element 10, which is ready for MTJ element photolithographic patterning process, is shown in FIG. 2.

Fourth Embodiment

Figure 5:
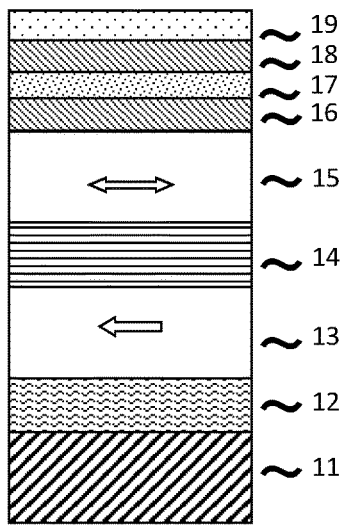
FIG. 5 is a cross-sectional view showing a configuration of an MTJ element 10 as deposited, according to the fourth embodiment.
Figure 6:
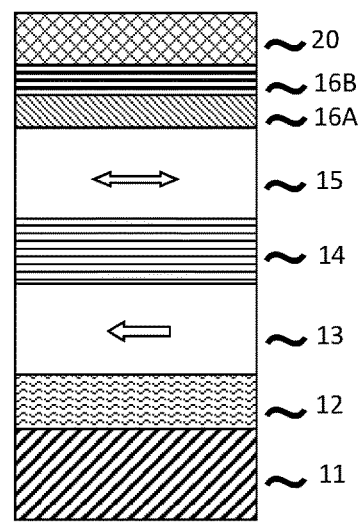
FIG. 6 is a cross-sectional view showing a configuration of an MTJ element 10 after an optional top surface oxidization of the remaining first cap sub-layer, followed by deposition of a upper-contact multilayer film comprising a buffer layer and a photoresist layer, according to the fourth embodiment.

Similar to above embodiments, the same cap multilayer can be adopted in a planar magnetoresistive element. FIG. 5 is a cross-sectional view showing an example configuration of the MTJ element 10 according to the fourth embodiment. All layered configuration can be identical to those of the third embodiment, except that the reference layer has an invariable magnetization in a direction parallel to a film surface and the recording layer has a variable magnetization in a direction parallel to a film surface. After the same thermal annealing and etching processes are utilized, the final configuration of the MTJ element 10, which is ready for MTJ element photolithographic patterning process, is shown in FIG. 6.

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A method of making a magnetoresistive element having a Boron-absorbing sacrificial layer comprising:
    forming a reference layer having magnetic anisotropy and having an invariable magnetization direction;
    forming a tunnel barrier layer provided on the reference layer;
    forming a recording layer provided on the tunnel barrier layer and having a variable magnetization direction;
    forming a first Boron-absorbing sacrificial layer provided on top surface of the recording layer;
    forming a second Boron-absorbing sacrificial layer provided on top surface of the first Boron-absorbing sacrificial layer;
    forming a protective layer provided on top surface of the second Boron-absorbing sacrificial layer;
    performing a thermal annealing process to the above as-deposit film stack;
    performing a first etching process to remove the protective layer, wherein the first etching process stops at the second Boron-absorbing sacrificial layer;
    performing a second etching process to remove the second Boron-absorbing sacrificial layer and at least the top portion of the first Boron-absorbing sacrificial layer by leaving a remaining bottom part of the first Boron absorbing sacrificial layer interfacing to the recording layer;
    performing an oxidization process provided to oxidize the remaining bottom part of the first Boron-absorbing sacrificial layer;
    forming a top-contact layer on the oxidized remaining bottom part of the first Boron-absorbing sacrificial layer;
    forming a buffer layer and a photoresist layer for further photo-lithographic processes of the magnetoresistive element.

2. The element of claim 1, wherein the first Boron-absorbing sacrificial layer is a single layer of metal selected from Ti, V, Nb, Hf, Zr, W, Mo, Cr, Mg, Al, or a single layer of alloy at least having one element selected from Ti, V, Nb, Hf, Zr, W, Mo, Cr, Mg, Al.

3. The element of claim 1, wherein the second Boron-absorbing sacrificial layer has a sufficiently lower etching rate during the first etching process for serving as an etch-stop layer.

4. The element of claim 1, wherein the first Boron-absorbing sacrificial layer is a low diffusivity metal layer having a bcc (body-centered cubic) or hcp (hexagonal close-packed) phase.

5. The element of claim 1, wherein the second Boron-absorbing sacrificial sub-layer is preferred to be a metal layer having stronger bond iconicity with Boron atom than the first sacrificial sub-layer.

6. The element claim 1, wherein the first Boron-absorbing sacrificial sub-layer is preferred to contain Ti.

7. The element of claim 1, wherein the second Boron-absorbing sacrificial sub-layer is preferred to contain Ta.

8. The element of claim 1, wherein the protective layer is preferred to have at least one element selected from Cu, Ru, Al, Rh, Ag, Au.

9. The method of claim 1, wherein the thermal annealing process is preferred to be conducted at an elevated temperature of at least 250-degree C.

10. The element of claim 1, wherein the second etching process comprises an IBE etching process, or an RIE etching process having CF4 gas chemistry.

11. The element of claim 1, wherein the first etching process comprises an RIE etching process having CH3OH gas chemistry, or NH3+CO mixed gas chemistry.

12. The element of claim 1, wherein the recording layer is a single ferromagnetic Boron alloy layer, preferred to be CoFeB or CoB, FeB, the B composition percentage is between 10%-30% with a preferred value of 20%.

13. The element of claim 1, wherein the recording layer is a multi-layer comprising at least a ferromagnetic Boron alloy layer, preferred to be CoFeB or CoB, FeB, the Boron composition percentage is between 10%-30% with a preferred value of 20%.

14. The element of claim 1, wherein the oxidization process is conducted by using a mixed gas containing natural, or radical, or ionized oxygen and Argon (Ar).

* * * * *